United States Patent
Tunks et al.

(10) Patent No.: US 9,950,834 B2
(45) Date of Patent: Apr. 24, 2018

(54) RACK DELIVERY SYSTEM

(71) Applicant: Dell Products L.P., Round Rock, TX (US)

(72) Inventors: Eric Tunks, Austin, TX (US); Steven Embleton, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 48 days.

(21) Appl. No.: 15/061,679

(22) Filed: Mar. 4, 2016

(65) Prior Publication Data
US 2017/0253374 A1    Sep. 7, 2017

(51) Int. Cl.
*B65D 19/44*    (2006.01)
*B65D 19/38*    (2006.01)
*H05K 7/14*    (2006.01)

(52) U.S. Cl.
CPC .......... *B65D 19/38* (2013.01); *B65D 19/44* (2013.01); *H05K 7/1488* (2013.01); *B65D 2519/0086* (2013.01); *B65D 2519/00815* (2013.01)

(58) Field of Classification Search
CPC ................................. B65D 19/38; B65D 19/00
USPC .......... 108/51.11, 53.1, 54.1, 57.12; 248/638
See application file for complete search history.

(56) References Cited

U.S. PATENT DOCUMENTS

| | | | | |
|---|---|---|---|---|
| 3,090,331 A | * | 5/1963 | McCann | B65D 19/0075 108/57.12 |
| 4,525,659 A | * | 6/1985 | Imahashi | F16F 15/03 318/611 |
| 4,662,133 A | * | 5/1987 | Kondo | E02D 27/34 248/567 |
| 4,717,025 A | * | 1/1988 | Maurer | B65D 19/20 108/51.3 |
| 5,219,051 A | * | 6/1993 | Davis | F16F 13/00 188/276 |
| 5,745,987 A | * | 5/1998 | Bartley | H05K 3/341 156/295 |
| 5,765,800 A | * | 6/1998 | Watanabe | F16F 15/0232 248/550 |

(Continued)

OTHER PUBLICATIONS

"ISO-Base Seismic Isolation Technology," 2009, pp. 1-2, Worksafe Technologies, http://www.iso-base.com.

*Primary Examiner* — Jose V Chen
(74) *Attorney, Agent, or Firm* — Haynes and Boone, LLP

(57) ABSTRACT

A device delivery system includes a base support member having vertical force dissipation member(s) that dissipate vertical forces, and a device support member that mounts to one or more devices. A horizontal movement subsystem couples the device support member to the base support member, and operates to allow the device support member to move relative to the base support member in a substantially horizontal plane during rack transport. Resilient member(s) extend between the base support member and the device support member, and operate to damp the movement of the device support member relative to the base support member in the substantially horizontal plane. A movement limiting subsystem may be provided on the base support member and the device support member, and may be activated to resist movement of the device support member relative to the base support member in the substantially horizontal plane during rack positioning.

29 Claims, 20 Drawing Sheets

(56) References Cited

U.S. PATENT DOCUMENTS

| | | | | |
|---|---|---|---|---|
| 5,812,958 | A * | 9/1998 | Mayama | F16F 15/02 |
| | | | | 700/280 |
| 5,911,179 | A * | 6/1999 | Spiczka | B65D 19/0095 |
| | | | | 108/51.11 |
| 5,970,886 | A * | 10/1999 | Knio | B65D 19/38 |
| | | | | 108/57.12 |
| 6,035,790 | A * | 3/2000 | Polando | B65D 19/44 |
| | | | | 108/55.1 |
| 6,418,862 | B1 * | 7/2002 | Heil | B65D 19/0028 |
| | | | | 108/57.12 |
| 6,463,863 | B1 * | 10/2002 | Ishikawa | B65D 19/385 |
| | | | | 108/53.1 |
| 7,320,455 | B2 * | 1/2008 | Ryaboy | F16F 7/1011 |
| | | | | 248/638 |
| 7,997,213 | B1 * | 8/2011 | Gauthier | B65D 88/022 |
| | | | | 108/53.1 |
| 8,991,780 | B2 * | 3/2015 | Pedersen | B65D 90/0033 |
| | | | | 108/57.12 |
| 2006/0032412 | A1 * | 2/2006 | Harner | B65D 19/06 |
| | | | | 108/55.1 |
| 2007/0221102 | A1 | 9/2007 | Reinhall | |
| 2007/0283858 | A1 * | 12/2007 | Ballard | B65D 19/0016 |
| | | | | 108/57.12 |
| 2011/0303129 | A1 * | 12/2011 | Harris | B65D 19/08 |
| | | | | 108/53.1 |
| 2014/0090581 | A1 * | 4/2014 | Schultz | F16F 15/067 |
| | | | | 108/57.12 |
| 2016/0023803 | A1 * | 1/2016 | Green | B65D 19/0095 |
| | | | | 108/57.12 |
| 2016/0061285 | A1 * | 3/2016 | Green | B65D 19/40 |
| | | | | 108/57.12 |

* cited by examiner

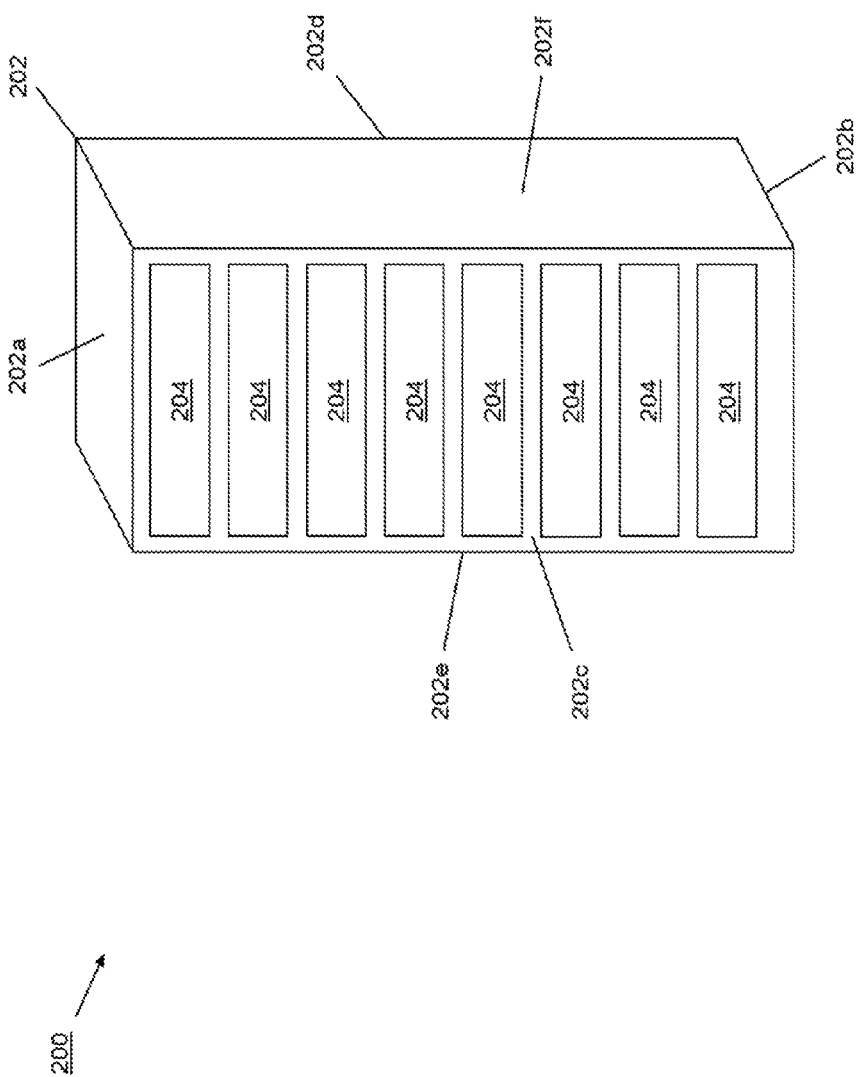

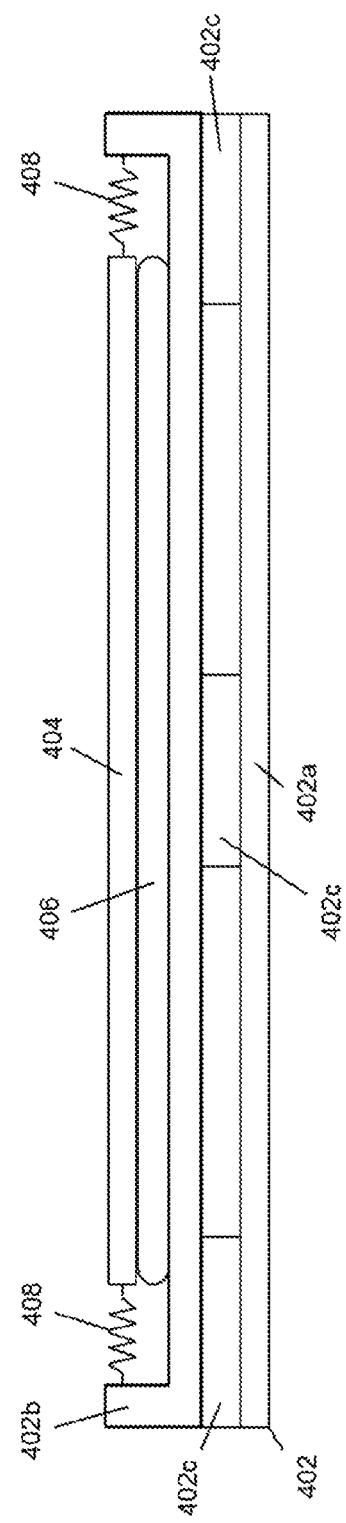

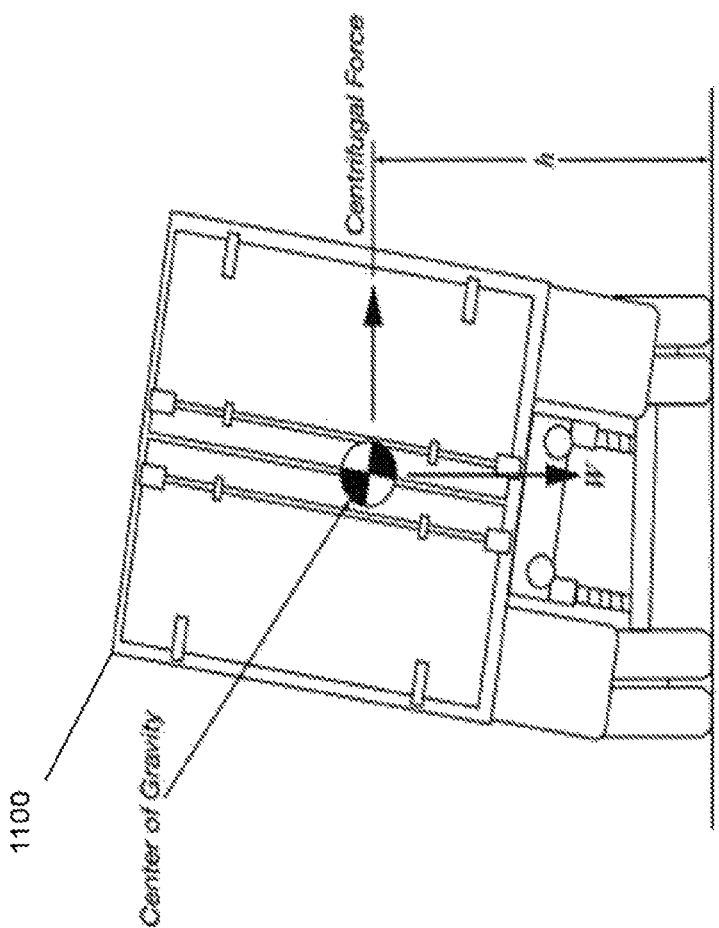

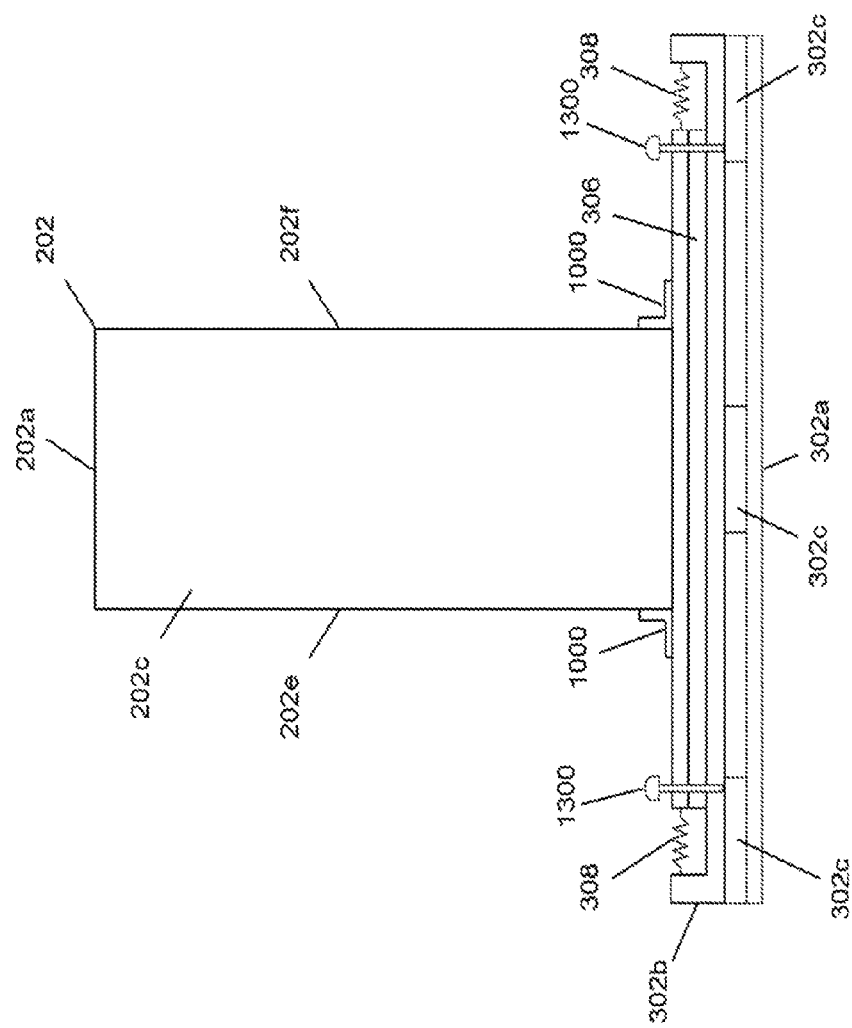

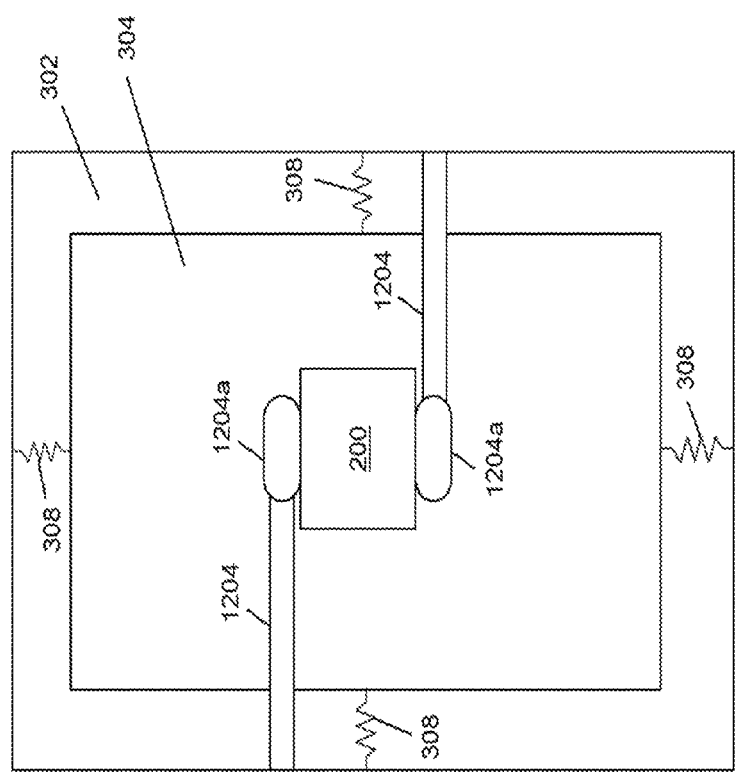

RACK DELIVERY SYSTEM

BACKGROUND

The present disclosure relates generally to information handling systems, and more particularly to a delivery system for racks that hold information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, servers, networking devices, storage systems, and/or other devices known in the art, are sometimes used in racks that house multiple devices that are coupled to each other as well as devices in other racks. Some of those racks are relatively tall to enable the rack to house a relatively large number of devices. For example, conventional 42 unit (42 U) racks may be up to 7 feet tall, and other rack types can exceed that height. The shipping and delivery of such racks can raise a number of issues. Conventional rack delivery systems typically involve rigidly mounting the rack to a shipping pallet (e.g., via brackets secured to the shipping pallet and bottom of the rack) that provides a wider base than the rack and increases the tip angle of the rack to reduce the chances of the rack tipping during shipping and delivery.

However, in addition to tipping, other concerns arise during rack shipping and delivery. For example, racks may be subject to relatively high forces during shipping and delivery that can damage the rack and/or components in the rack, which may be shipped and delivered with up to $1 million US dollars of equipment. Conventional solutions to dealing with such forces during rack delivery and shipping have included the use of foam as a layer in the shipping pallet (sometimes referred to as a "shock pallet") that is configured to absorb vertical forces that may be induced during delivery (e.g., in a truck or other delivery vehicle) and transmitted to the shipping pallet. However, it has been found that racks may experience significant horizontal motion that can provide damaging forces on the rack as well. For example, forces induced by the rack delivery vehicle during rack shipping and delivery are typically transmitted to the bottom portion of the rack (e.g., at the mounting location to the shipping pallet), and have been found to introduce significant horizontal motion at the unconstrained top portion of the rack, which can result in bending of structural members in the rack, seizing of rack casters, and in extreme cases, rack component damage.

Accordingly, it would be desirable to provide an improved rack delivery system.

SUMMARY

According to one embodiment, a rack delivery system includes a rack that is configured to house a plurality of computing devices; a rack shipping pallet that is mounted to the rack, wherein the rack shipping pallet includes: a base support member that includes at least one vertical force dissipation member that is configured to dissipate vertical forces transmitted to the base support member; a rack support member that mounted to the rack; a horizontal movement subsystem that couples the rack support member to the base support member, wherein the horizontal movement subsystem provides for movement of the rack support member relative to the base support member in a substantially horizontal plane when the base support member is subject to a force; and at least one resilient member that extends between the base support member and the rack support member, wherein the at least one resilient member is configured to damp the movement of the rack support member relative to the base support member in the substantially horizontal plane.

BRIEF DESCRIPTION OF THE DRAWINGS

FIG. 2 is a schematic perspective view illustrating an embodiment of a rack.

FIG. 4 is a schematic cross-sectional view illustrating an embodiment of the rack delivery system of FIGS. 3A and 3B.

FIG. 12B is a schematic rear view illustrating an embodiment of the rack delivery vehicle of FIG. 11 moving the rack and rack delivery system of FIG. 10.

FIG. 13 is a schematic side view illustrating an embodiment of the rack and rack delivery system of FIG. 10 with relative movement of the rack delivery system components resisted.

FIG. 16B is a schematic top view illustrating an embodiment of the rack and rack delivery vehicle of FIG. 16A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
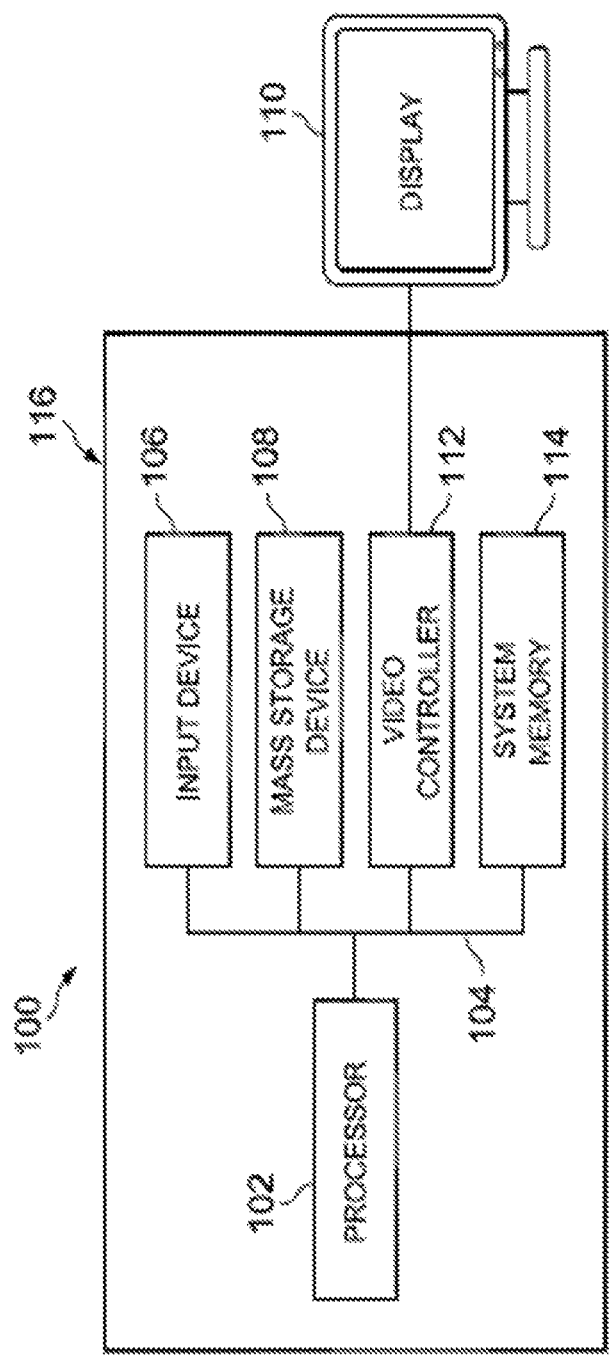
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIG. 2, an embodiment of a rack 200 is illustrated. While the rack 200 is discussed herein as housing servers (e.g., a 42 U rack), one of skill in the art in possession of the present disclosure will recognize that the rack 200 may house other types of computing devices including networking devices (e.g., switches, routers, etc.), storage subsystems, and/or other rack devices known in the art. The rack 200 includes a base 202 having a top wall 202a, a bottom wall 202b that is located opposite the base 202 from the top wall 202a, a front wall 202c that extends between the top wall 202a and the bottom wall 202b, a rear wall 202d that is located opposite the base 202 from the front wall 202c and extends between the top wall 202a and the bottom wall 202b, and a pair of side walls 202e and 202f that are located opposite the base 202 from each other and that extend between the top wall 202a, the bottom wall 202b, the front wall 202c, and the rear wall 202d. A plurality of servers 204 are housed in the rack 202 and, as such, the base 202 of the rack 200 may define server slots that are configured to house the servers 204. For example, any of the top wall 202a, the bottom wall 202b, the front wall 202c, the rear wall 202d, and the side walls 202e and 202f may help define the server slots, and may include features for guiding, coupling, and securing the servers 204 in the server slots. Furthermore, features for cable routing and management, features for coupling other devices to the rack, and/or other rack mechanisms that have not been illustrated for clarity may be provided in the rack 200 while remaining within the scope of the present disclosure. Furthermore, one of skill in the art in possession of the present disclosure will recognize that while the rack 200 is illustrated with solid walls for clarity, those walls may (and typically will) be replaced with a structural frame that defines opening that allow access to the servers 204 while remaining within the scope of the present disclosure.

Figure 3A:
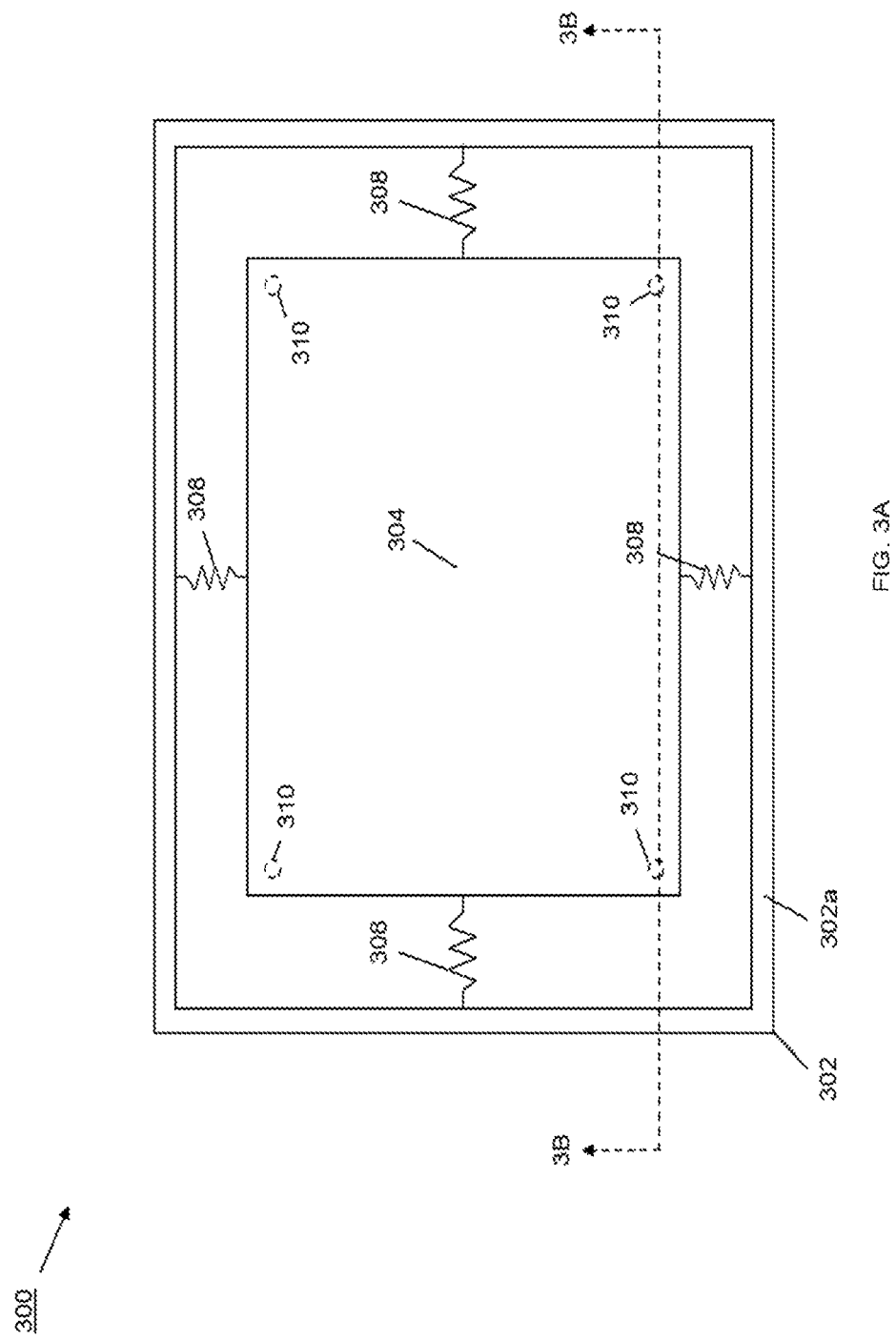
FIG. 3A is a schematic top view illustrating an embodiment of a rack delivery system.
Figure 3B:
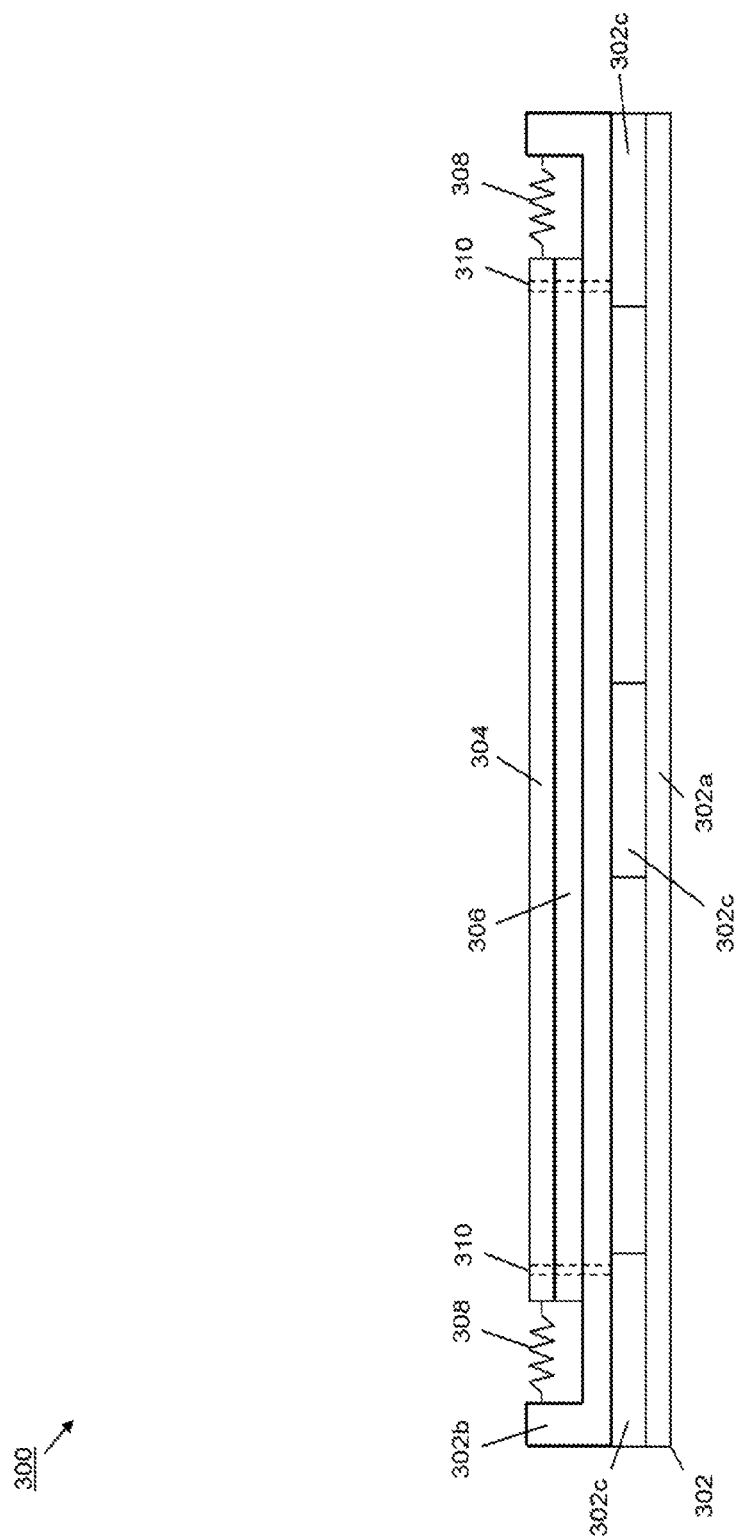
FIG. 3B is a schematic cross-sectional view illustrating an embodiment of the rack delivery system of FIG. 3A.

Referring now to FIGS. 3A and 3B, an embodiment of a device delivery system is illustrated. In the embodiments discussed below, the device delivery system is illustrated and described as a rack delivery system 300 that is provided for the delivery of racks such as the rack 200 discussed above with reference to FIG. 2. However, the device delivery system is envisioned as providing benefits for the delivery of other types of devices, and thus the use of the device delivery system with those other devices is envisioned as falling within the scope of the present disclosure. In the illustrated embodiment, the rack delivery system 300 includes a base support member 302 having a first layer 302a and a second layer 302b that are coupled together by a plurality of vertical force dissipation members 302c. For example, the base support member 302 may be provided using a wooden material (e.g., plywood) for each of the first layer 302a and the second layer 302b, and using a hardened foam material for the vertical force dissipation members 302c. However, a variety of other structural materials may be utilized for the layers 302a and 302b, including metal materials, plastic materials, and/or other structural materials that are envisioned as falling within the scope of the present disclosure. Similarly, a variety of other force dissipation materials may be utilized for the vertical force dissipation members 302c, including springs, rubber materials, plastic materials, and/or other damping materials that are configured to provide the vertical for dissipation discussed below.

The rack delivery system 300 also includes a rack support member 304 that is coupled to the base support member 302 by a horizontal movement subsystem 306 and a plurality of resilient members 308. In an embodiment, the rack support member 304 may be provided using a wooden material (e.g., plywood). However, a variety of other structural materials may be utilized for the rack support layer 304, including metal materials, plastic materials, and/or other structural materials that would be apparent to one of skill in the art in possession of the present disclosure. In the illustrated embodiment, the horizontal movement subsystem 306 is schematically illustrated as located between the base support member 302 and the rack support member 304, and as discussed below the horizontal movement subsystem 306 may be provided using a variety of structures, materials, and/or configurations to allow the rack support member 304 to move relative to the base support member 302 in a substantially horizontal plane, as discussed in further detail below. In the illustrated embodiment, the resilient members 308 are illustrated as extending between the rack support member 304 and a perimeter lip on the base support member 302, but other configurations of the resilient members 308 are envisioned as falling within the scope of the present disclosure. Furthermore, while the resilient members 308 are schematically illustrated as being provided by springs, a variety of other resilient materials may be utilized for the resilient members 308, including foam materials, rubber materials, plastic materials, and/or other resilient materials that are configured to provide the horizontal motion damping and horizontal force dissipation discussed below.

In some embodiments, a movement limiting subsystem 310 is provided on the base support member 302 and the rack support member 304. For example, in FIGS. 3A and 3B the movement limiting subsystem 310 includes holes that are defined by the base support member 302, the rack support member 304, and the horizontal movement subsystem 306, and the holes are configured to receive pin(s) to activate the movement limiting subsystem to resist movement of the rack support member 304 relative to the base support member 302 in the substantially horizontal plane. However, a variety of other engagement and/or locking mechanisms that are configured to be activated to prevent relative movement of the base support member 302 and the rack support member 304 are envisioned as falling within the scope of the present disclosure. As illustrated in some of the embodiments of the rack delivery systems discussed below, the movement limiting subsystem 310 may be omitted in situations where, for example, the relative movement of the base support member 302 and the rack support member 304 is not an issue. While a specific embodiment of a device delivery system/rack delivery system 300 has been illustrated and described, one of skill in the art in possession of the present disclosure will recognize that other features may be provided on the rack delivery system 300 (e.g., rack or device mounting features, handles, wheels, and/or other specific-use-dependent features) while remaining within the scope of the present disclosure.

Referring now to FIG. 4, a rack delivery system 400 is illustrated to provide an example of a specific embodiment of the horizontal movement subsystem 306 discussed above with reference to FIG. 3. As such, the rack delivery system 400 includes similar features as the rack delivery system 300 discussed above. In the illustrated example, the rack delivery system 400 includes base support member 402 having a first layer 302a and a second layer 402b that are coupled together by a plurality of vertical force dissipation members 402c. The rack delivery system 400 also includes a rack support member 404 that is coupled to the base support member 402 by a horizontal movement subsystem 406 and a plurality of resilient members 408. While not illustrated, the rack delivery subsystem 400 may include a movement limiting subsystem that is similar to the movement limiting subsystem 310 discussed above with reference to FIG. 3.

In the embodiment illustrated in FIG. 4, the horizontal movement subsystem 406 is provided by a fluid bladder that engages each of the second layer 402b on the base support member 302 and the rack support member 404, and that is configured to deform to allow the rack support member 404 to move relative to the base support member 402 in a substantially horizontal plane. For example, the fluid bladder may be provided by a rubber material, a plastic material, and/or other deformable materials that would be apparent to one of skill in the art in possession of the present disclosure, and that fluid bladder may be filled with fluids such as water and/or other relatively non-compressible fluids known in the art. Furthermore, in place of or in addition to fluids, other substances such as gels and gasses may be provided in the bladder to allow for the relative movement of the rack support member 404 and base support member 402 discussed below while remaining within the scope of the present disclosure. As discussed in further detail below, the fluid, fluid bladder material, resilient members 408, and vertical force dissipation members 402c may be selected, dimensioned, and/or otherwise provided based on forces that are expected to be generated during delivery of the rack 200 in order to allow for deformation of the fluid bladder in a manner that provides sufficient horizontal movement of the rack support member 404 relative to the base support member 402, with the associated force dissipation provided by the vertical force dissipation members 402c and resilient members 408, such that those forces will not damage the rack 200 and/or any components in the rack 200. As such, the fluid, fluid bladder material, resilient members 408, and vertical force dissipation members 402c may vary based on, for example, intended delivery methods used with the rack delivery system 400.

Figure 5:
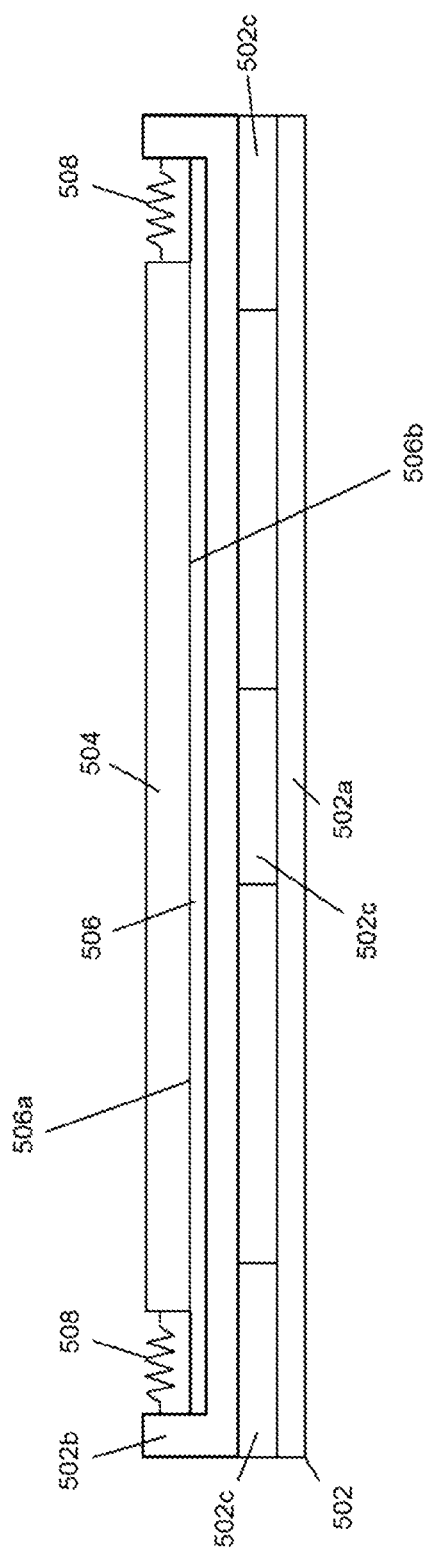
FIG. 5 is a schematic cross-sectional view illustrating an embodiment of the rack delivery system of FIGS. 3A and 3B.

Referring now to FIG. 5, a rack delivery system 500 is illustrated to provide an example of a specific embodiment of the horizontal movement subsystem 306 discussed above with reference to FIG. 3. As such, the rack delivery system 500 includes similar features as the rack delivery system 300 discussed above. In the illustrated example, the rack delivery system 500 includes base support member 502 having a first layer 502a and a second layer 502b that are coupled together by a plurality of vertical force dissipation members 502c. The rack delivery system 500 also includes a rack support member 504 that is coupled to the base support member 502 by a horizontal movement subsystem 506 and a plurality of resilient members 508. While not illustrated, the rack delivery subsystem 500 may include a movement limiting subsystem that is similar to the movement limiting subsystem 310 discussed above with reference to FIG. 3.

In the embodiment illustrated in FIG. 5, the horizontal movement subsystem 506 is provided by a first flat surface 506a on the base support member 502 that engages a second flat surface 506b on the rack support member 504, with the first flat surface 506a configured to move relative to the second flat surface 506b to allow the rack support member 504 to move relative to the base support member 502 in a substantially horizontal plane. For example, the first flat surface 506a and the second flat surface 506b may be provided by complementary and relatively low friction surfaces that may include plastics, metals, and/or other relatively low-friction materials that would be apparent to one of skill in the art in possession of the present disclosure. Furthermore, the first surface 506a and the second surface 506b may be coated with greases, gels, and/or other fluids or friction-reducing coatings in order to allow for the relative movement of the rack support member 504 and base support member 502 discussed below while remaining within the scope of the present disclosure. As discussed in further detail below, the surfaces 506a and 506b, coatings, resilient members 508, and vertical force dissipation members 502c may be selected, dimensioned, and/or otherwise provided based on forces that are expected to be generated during delivery of the rack 200 in order to allow for low-friction surface engagement that provides sufficient horizontal movement of the rack support member 504 relative to the base support member 502, with the associated force dissipation provided by the vertical force dissipation members 502c and resilient members 508, such that those forces will not damage the rack 200 and/or any components in the rack 200. As such, the surfaces 506a and 506b, coatings, resilient members 508, and vertical force dissipation members 502c may vary based on, for example, intended delivery methods used with the rack delivery system 500.

Figure 6:
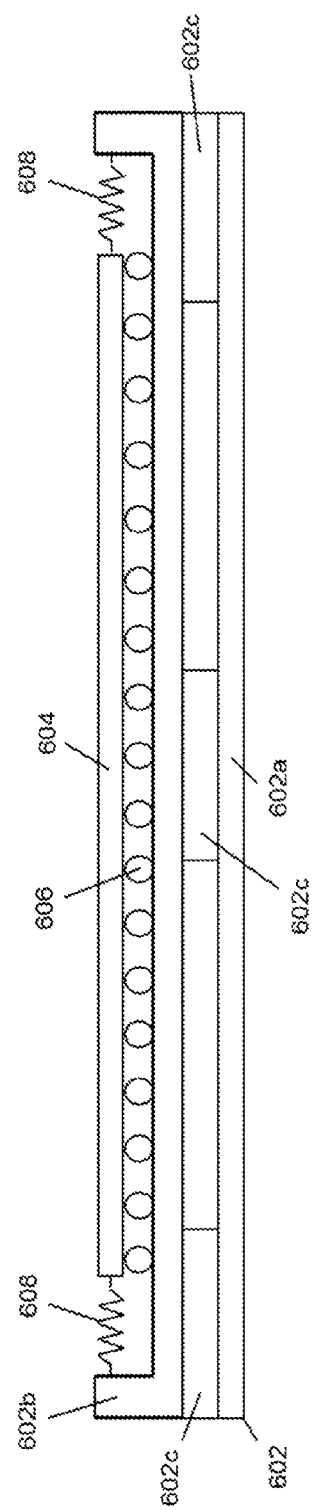
FIG. 6 is a schematic cross-sectional view illustrating an embodiment of the rack delivery system of FIGS. 3A and 3B.

Referring now to FIG. 6, a rack delivery system 600 is illustrated to provide an example of a specific embodiment of the horizontal movement subsystem 306 discussed above with reference to FIG. 3. As such, the rack delivery system 600 includes similar features as the rack delivery system 300 discussed above. In the illustrated example, the rack delivery system 600 includes base support member 602 having a first layer 602a and a second layer 602b that are coupled together by a plurality of vertical force dissipation members 602c. The rack delivery system 600 also includes a rack support member 604 that is coupled to the base support member 602 by a horizontal movement subsystem 606 and a plurality of resilient members 608. While not illustrated, the rack delivery subsystem 600 may include a movement limiting subsystem that is similar to the movement limiting subsystem 310 discussed above with reference to FIG. 3.

In the embodiment illustrated in FIG. 6, the horizontal movement subsystem 606 is provided by a plurality of rotatable members that each engage the base support member 602 and the rack support member 604, with each rotatable member configured to rotate to allow the rack support member 604 to move relative to the base support member 602 in a substantially horizontal plane. For example, the rotatable members may be provided by spheres that may include plastics, metals, and/or other materials that would be apparent to one of skill in the art in possession of the present disclosure. In other examples, the rotatable members may be provided by cylinders (e.g., when horizontal movement in only one direction is of substantial concern) or other rotatable elements while remaining within the scope of the present disclosure. Furthermore, the rotatable members may be coated with greases, gels, and/or other fluids or friction-reducing coatings in order to allow for the relative movement of the rack support member 604 and base support member 602 discussed below while remaining within the scope of the present disclosure. As discussed in further detail below, the rotatable members, coatings, resilient members 608, and vertical force dissipation members 602c may be selected, dimensioned, and/or otherwise provided based on forces that are expected to be generated during delivery of the rack 200 in order to allow for rotation that provides sufficient horizontal movement of the rack support member 604 relative to the base support member 602, with the associated force dissipation provided by the vertical force dissipation members 602c and resilient members 608, such that those forces will not damage the rack 200 and/or any components in the rack 200. As such, the rotatable members, coatings, resilient members 608, and vertical force dissipation members 602c may vary based on, for example, intended delivery methods used with the rack delivery system 600.

Figure 7:
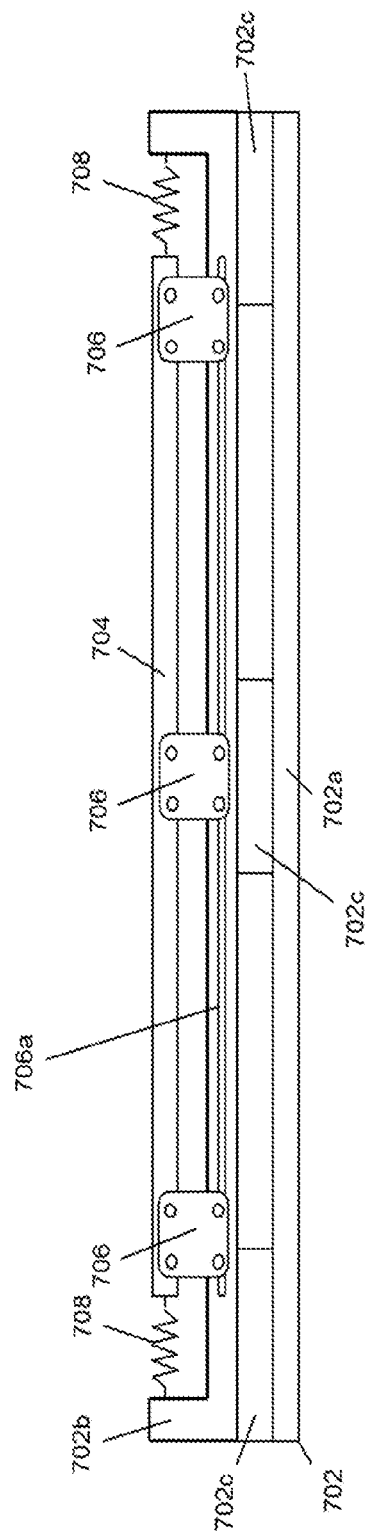
FIG. 7 is a schematic cross-sectional view illustrating an embodiment of the rack delivery system of FIGS. 3A and 3B.

Referring now to FIG. 7, a rack delivery system 700 is illustrated to provide an example of a specific embodiment of the horizontal movement subsystem 306 discussed above with reference to FIG. 3. As such, the rack delivery system 700 includes similar features as the rack delivery system 300 discussed above. In the illustrated example, the rack delivery system 700 includes base support member 702 having a first layer 702a and a second layer 702b that are coupled together by a plurality of vertical force dissipation members 702c. The rack delivery system 700 also includes a rack support member 704 that is coupled to the base support member 702 by a horizontal movement subsystem 706 and a plurality of resilient members 708. While not illustrated, the rack delivery subsystem 700 may include a movement limiting subsystem that is similar to the movement limiting subsystem 310 discussed above with reference to FIG. 3.

In the embodiment illustrated in FIG. 7, the horizontal movement subsystem 706 is provided by a plurality of mechanical linkages that each engage the base support member 702 and the rack support member 704, with each mechanical linkage configured to allow the rack support member 704 to move relative to the base support member 702 in a substantially horizontal plane. For example, a slot 706a may be defined in the second layer 702b on the base support member 702, and each mechanical linkage may be mounted to the rack support member 704 and coupled to the second layer 702b of the base support member 702 by at least one element that is configured to move through the slot 706a. For example, the at least one element on each mechanical linkage that is configured to move through the slot 706a may be configured to move at least partway along the length of the slot 706a, as well as in and out of the slot 706a in some cases, in order to provide for movement along multiple axis of a substantially horizontal plane. Furthermore, the mechanical linkages may be coated with greases, gels, and/or other fluids or friction-reducing coatings in order to allow for the relative movement of the rack support member 704 and base support member 702 discussed below while remaining within the scope of the present disclosure. As discussed in further detail below, the mechanical linkages, coatings, resilient members 708, and vertical force dissipation members 702c may be selected, dimensioned, and/or otherwise provided based on forces that are expected to be generated during delivery of the rack 200 in order to allow for sufficient horizontal movement of the rack support member 704 relative to the base support member 702, with the associated force dissipation provided by the vertical force dissipation members 702c and resilient members 708, such that those forces will not damage the rack 200 and/or any components in the rack 200. As such, the rotatable members, coatings, resilient members 708, and vertical force dissipation members 702c may vary based on intended delivery methods used with the rack delivery system 700.

Figure 8:
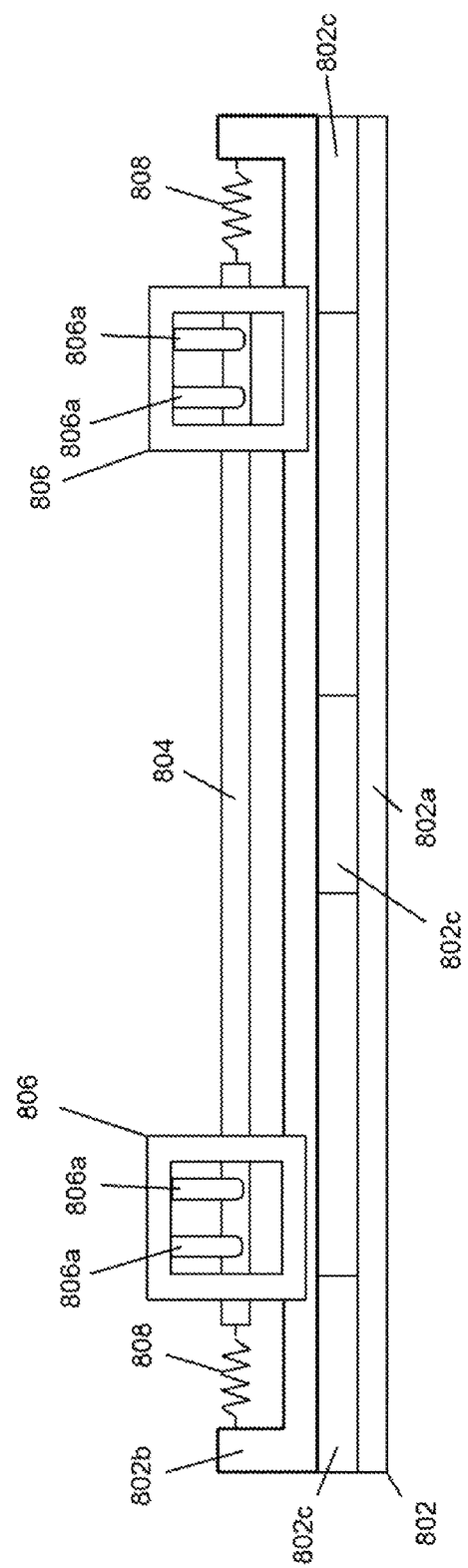
FIG. 8 is a schematic cross-sectional view illustrating an embodiment of the rack delivery system of FIGS. 3A and 3B.

Referring now to FIG. 8, a rack delivery system 800 is illustrated to provide an example of a specific embodiment of the horizontal movement subsystem 306 discussed above with reference to FIG. 3. As such, the rack delivery system 800 includes similar features as the rack delivery system 300 discussed above. In the illustrated example, the rack delivery system 800 includes base support member 802 having a first layer 802a and a second layer 802b that are coupled together by a plurality of vertical force dissipation members 802c. The rack delivery system 800 also includes a rack support member 804 that is coupled to the base support member 802 by a horizontal movement subsystem 806 and a plurality of resilient members 808. While not illustrated, the rack delivery subsystem 800 may include a movement limiting subsystem that is similar to the movement limiting subsystem 310 discussed above with reference to FIG. 3.

In the embodiment illustrated in FIG. 8, the horizontal movement subsystem 806 is provided by a plurality of mechanical linkages that each engage the base support member 802 and the rack support member 804, with each mechanical linkage configured to allow the rack support member 804 to move relative to the base support member 802 in a substantially horizontal plane. For example, each mechanical linkage 806 may be mounted to the second layer 802b on the base support member 802, and each mechanical linkage may include a pair of rotatable elements 806a that are mounted to the rack support member 804 and configured to move about their rotatable coupling to the mechanical linkage. For example, the rotatable elements 806a on each mechanical linkage may be configured to "swing" about their rotatable couplings to the mechanical linkage in order to allow the rack support member 804 to move in a substantially horizontal plane relative to the base support member 802. Furthermore, the mechanical linkages may be coated with greases, gels, and/or other fluids or friction-reducing coatings in order to allow for the relative movement of the rack support member 804 and base support member 802 discussed below while remaining within the scope of the present disclosure. As discussed in further detail below, the mechanical linkages, coatings, resilient members 808, and vertical force dissipation members 802c may be selected, dimensioned, and/or otherwise provided based on forces that are expected to be generated during delivery of the rack 200 in order to allow for sufficient horizontal movement of the rack support member 804 relative to the base support member 802, with the associated force dissipation provided by the vertical force dissipation members 802c and resilient members 808, such that those forces will not damage the rack 200 and/or any components in the rack 200. As such, the rotatable members, coatings, resilient members 808, and vertical force dissipation members 802c may vary based on intended delivery methods used with the rack delivery system 800.

While a few specific examples of horizontal movement subsystems have been illustrated and described above, one of skill in the art in possession of the present disclosure will recognize that other mechanism may be utilized to provide for the horizontal movement of the rack support member relative to the base support member in the manner described below. For example, magnetic horizontal movement subsystems may be utilized that include repelling magnets on the rack support member and base support member that provide sufficient repelling forces that allow the rack support member to "float" above the base support member and thus provide for the movement in the substantially horizontal plane as discussed below. Similarly, pneumatic horizontal movement subsystems may be utilized that utilize air or fluid pressure between the rack support member and base support member that allows the rack support member to float above the base support member and thus provide for the movement in the substantially horizontal plane as discussed below. Thus, a wide variety of modification to the specific embodiments discussed above is envisioned as falling within the scope of the present disclosure.

Figure 9:
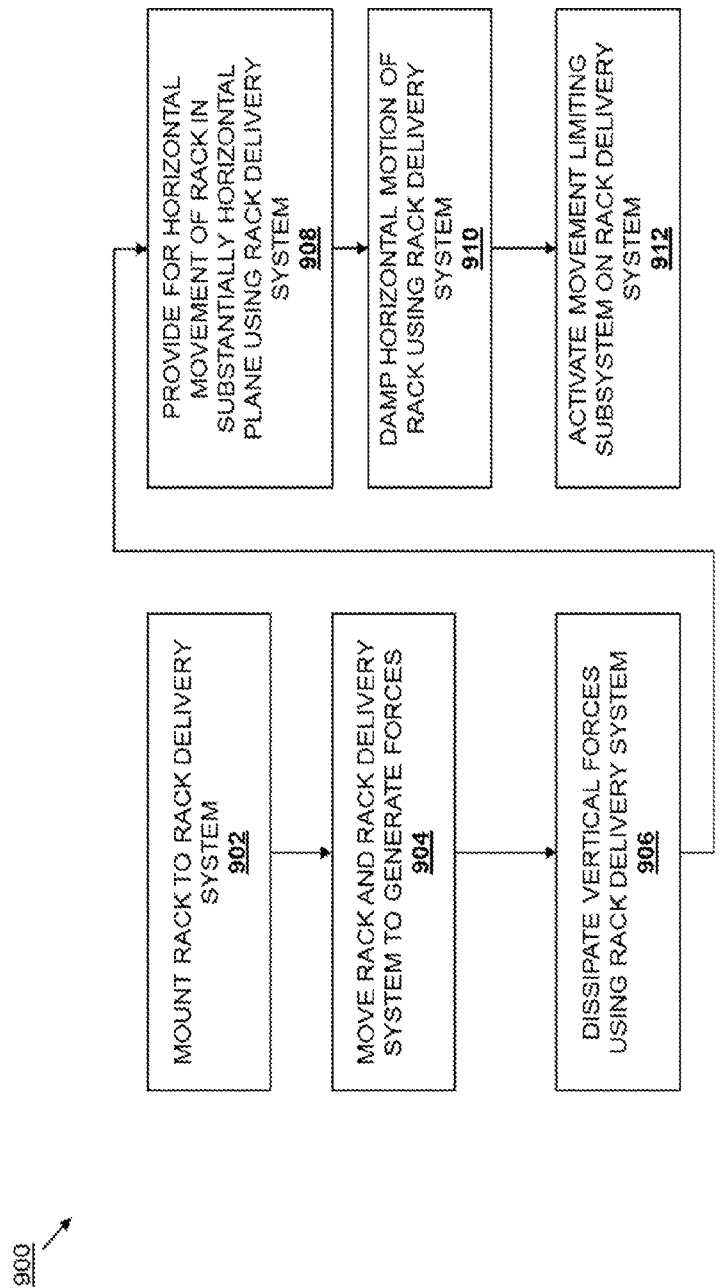
FIG. 9 is a flow chart illustrating an embodiment of a method for delivering a rack.

Referring now to FIG. 9, an embodiment of a method 900 for delivering a rack is illustrated. As discussed below, the systems and methods of the present disclosure provide for the mounting of racks and other devices to a rack support member on a rack delivery system that is configured to move in a substantially horizontal plane relative a base support member on the rack delivery system. The rack delivery system may then be positioned in a delivery vehicle with the base support member engaging a support surface, and when forces are generated through the support surface to the base support member during delivery of the rack, the rack support member moves relative to the base support member to dissipate those forces and prevent them from being transmitted directly to the rack, thus preventing those forces from damaging the rack and/or components of the rack. As such, racks may be transported to customers in any a variety of manners that can generate relatively high forces, and those forces will be dissipated without being transmitted to the rack, thus ensuring rack delivery without damage that can result in lost revenue and customer dissatisfaction.

Figure 10:
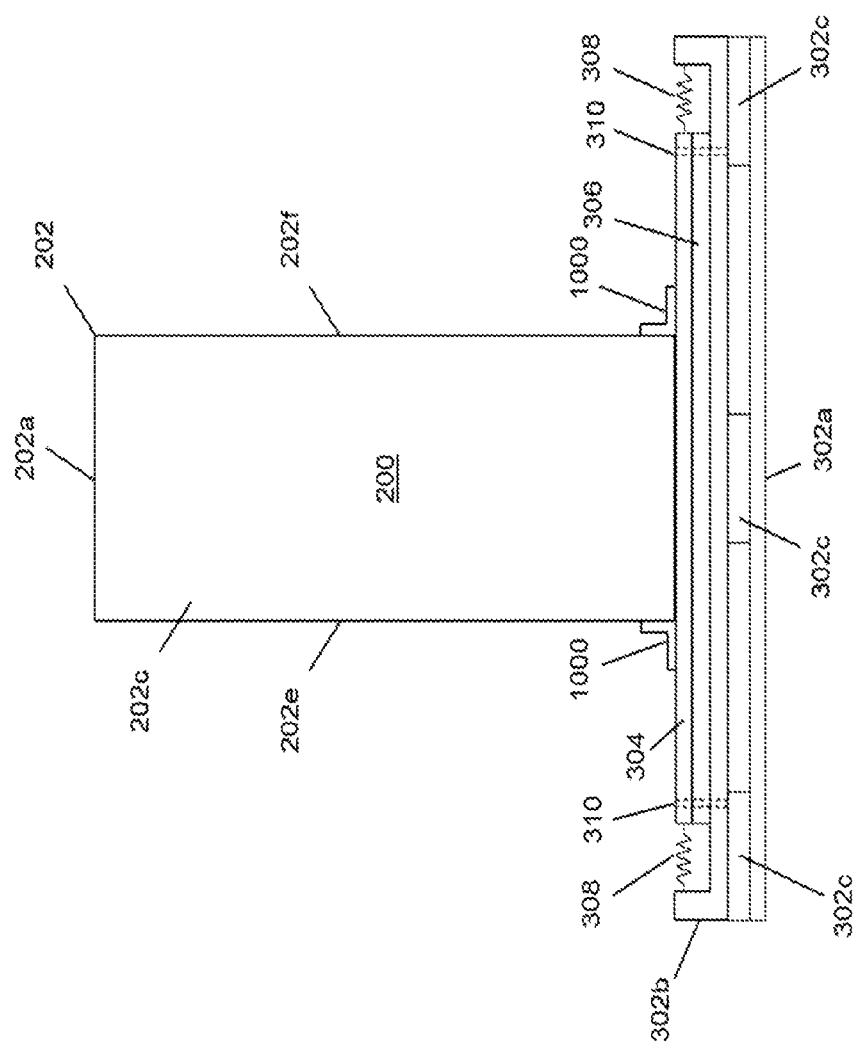
FIG. 10 is a schematic side view illustrating an embodiment of the rack of FIG. 2 mounted to the rack delivery system of FIGS. 3A and 3B.

The method 900 begins at block 902 where a rack is mounted to a rack delivery system. As illustrated in FIG. 10, the rack 200 discussed above with reference to FIG. 2 may be mounted to the rack delivery system 300 discussed above with reference to FIGS. 3A and 3B. For example, a plurality of mounting devices 1000 may be mounted to each of the rack 200 and the rack support member 304 using, for example, fasteners, adhesives, locking mechanisms, and/or other mounting devices known in the art. In some embodiments, the mounting devices 1000 may be included on the rack support member 304 and configured to engage the rack 200. In other embodiments, the mounting devices 1000 may be included on the rack 200 and configured to engage the rack support member 304. In yet other embodiments, the mounting devices 1000 may be coupled to both of the rack 200 and the rack support member 304. While only two mounting devices are illustrated, any number of mounting devices may be utilized to mount the rack 200 to the rack support member 304 to prevent relative movement of the rack 200 and the rack support member 304. One of skill in the art in possession of the present disclosure will recognize that the mounting devices 1000 may be selected, dimensioned, and/or otherwise provided depending on the height, weight, and/or other characteristics of the rack 200 to ensure that the rack 200 may be sufficiently secured to the rack support member 304 during delivery of the rack 200.

Figure 11:
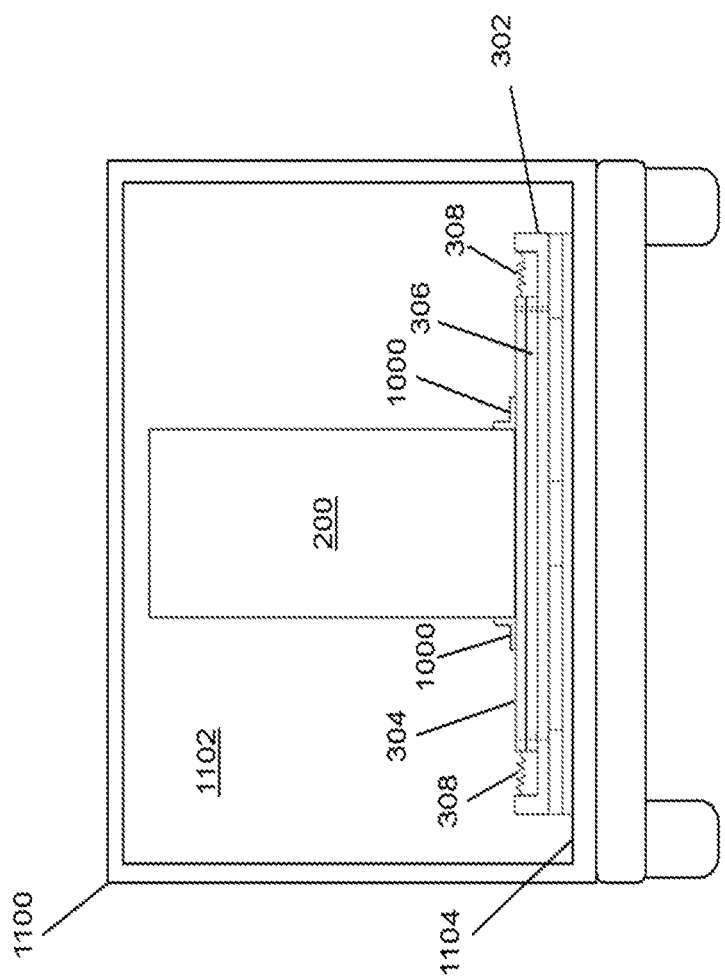
FIG. 11 is a schematic side view illustrating an embodiment of the rack and rack delivery system of FIG. 10 located in a rack delivery vehicle.

The method 900 then proceeds to block 904 where the rack and rack delivery system are moved to generate forces. As illustrated in FIG. 11, the rack 200/rack delivery system 300 may be positioned in a rack delivery vehicle 1100 that defines a rack delivery housing 1102 and that includes a rack delivery support surface 1104 adjacent the rack delivery housing 1102. In the embodiment of FIG. 11, the rack delivery vehicle 1100 is illustrated and described as a delivery truck. However, in other embodiments, the rack delivery vehicle may include planes, trains, carts, and/or virtually any other vehicle that is configured to transport the rack 200 between locations. At block 904, the rack 200/rack delivery system 300 are positioned in the rack delivery housing 1102 of the rack delivery vehicle 1100 such that the first layer 302a of the base support member 302 engages the rack delivery support surface 1104. While only a single rack 200/rack delivery system 300 are illustrated as located in the rack delivery housing 1100, one of skill in the art in possession of the present disclosure will recognize that many more rack/rack delivery subsystems may (and typically will) be delivered in a rack delivery vehicle while remaining within the scope of the present disclosure.

Figure 12A:
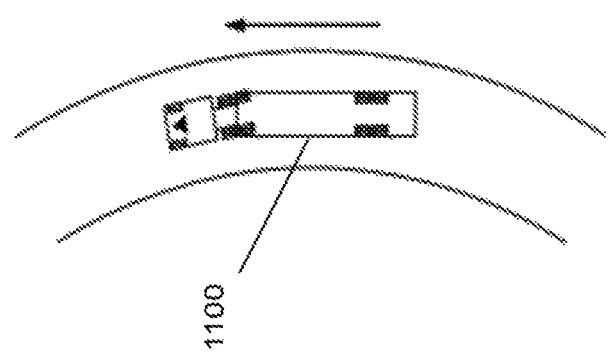
FIG. 12A is a schematic top view illustrating an embodiment of the rack delivery vehicle of FIG. 11 moving the rack and rack delivery system of FIG. 10.
Figure 12C:
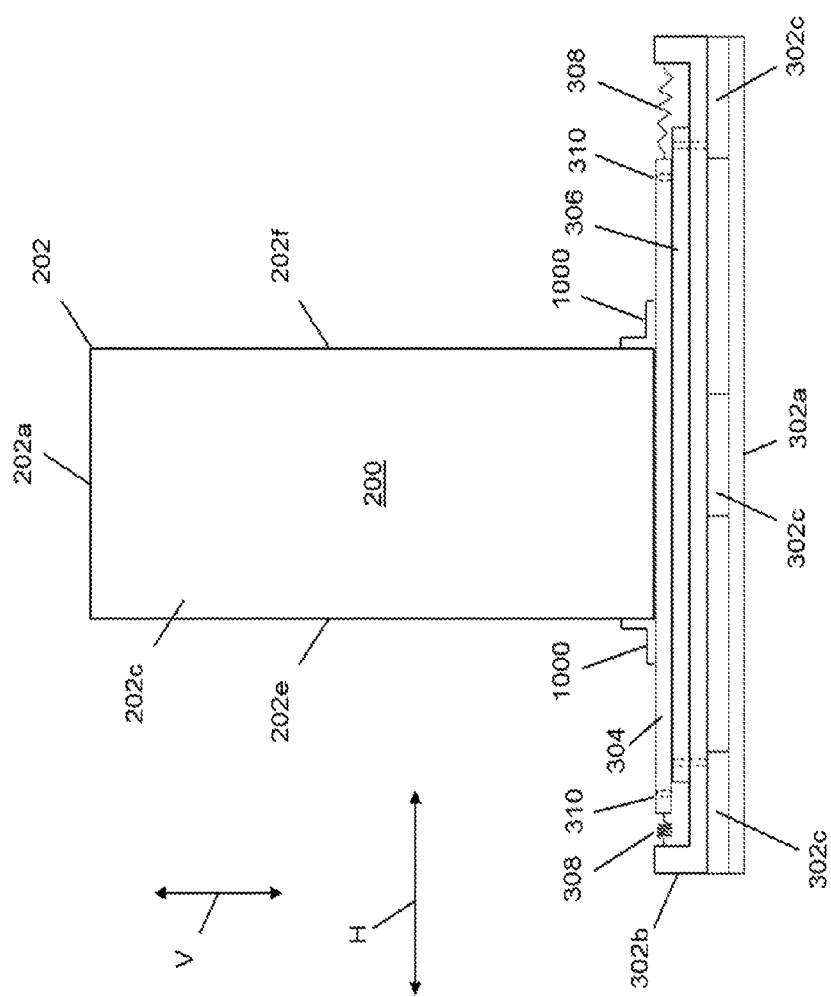
FIG. 12C is a schematic side view illustrating an embodiment of the rack and rack delivery system of FIG. 10 subject to forces during delivery.

Referring now to FIGS. 11, 12A, 12B, and 12C, the rack delivery vehicle 1100 may then move in order to move the rack 200/rack delivery system 300 between locations. During movement of the rack delivery vehicle 1100, forces are generated through the rack delivery vehicle 1100 and transmitted to the rack delivery system 300 through the rack delivery support surface 1104. For example, a plurality of vertical forces V are generated at block 904 through movement of the rack delivery vehicle 1100 (e.g., via bumps in the roads, hills, etc.), and a plurality of horizontal forces H are generated at block 904 through movement of the rack delivery vehicle 1100 (e.g., via uneven surfaces, centripetal force due to turns in the road, etc.) FIGS. 12A and 12B illustrate an example of the movement of the rack delivery vehicle 1100 on a road and the forces that may be generated as a result, although other movements and forces will fall within the scope of the present disclosure as well. In an embodiment, the vertical forces V and the horizontal forces H generated at block 904 are transmitted through the rack delivery support surface 1104 to the first layer 302a of the base support member 302. For example, in experimental embodiments involving the delivery of racks using trucks, it was found that vertical forces of up to 10 g and horizontal forces of up to 4 g were generated and transmitted to racks during movement of the truck.

The method 900 then proceeds to block 906 where vertical forces are dissipated using the rack delivery system. In an embodiment, the vertical force dissipation members 302c operate at block 906 to dissipate vertical forces transmitted to the base support member 302 by deforming, absorbing, and/or otherwise dissipating a portion of the forces generated at block 904. For example, at block 906 the vertical forces V generated at block 904 may be transmitted through rack delivery support surface 1104 to the first layer 302a on the base support member 302 and, in response, may impart vertical motion to the first layer 302a of the base support member 302 that transmits the vertical forces V to the vertical force dissipation members 302c. In a specific example, the vertical force dissipation members 302c include a foam material between the first layer 302a and the second layer 302b of the base support member 302, and that foam material is configured to deform, absorb, and/or dissipate a portion of the vertical force V, such that that vertical forces V transmitted through the rack delivery support surface 1104 to the first layer 302a of the base support member 302 are substantially reduced (e.g., from the 10 g forces that have been found in experimental embodiments to under 1 g forces in desirable frequency ranges) by the foam material before those reduced vertical forces are transmitted through the second layer 302b of the base support member 302, the horizontal movement subsystem 306, the rack support member 304, and to the rack 200. "Transmissibility" describes how much the energy input into the rack delivery vehicle 1100 has been modified by the rack delivery system before it reaches the rack, and when you look at the transmissibility over the frequency range of 1-200 Hz, there are points where the energy that reaches the rack is greater (i.e., the rack delivery system resonances) than the energy input, and points where the energy that reaches the rack is less (i.e., the rack delivery system anti-resonances) than the energy input. As such, the rack delivery system may be designed to maximize the anti-resonances and minimize the resonances by, for example, keeping resonances below a gain of 2 and maximizing the bandwidth of the anti-resonances. Furthermore, one of skill in the art in possession of the present disclosure will recognize how in some embodiments, the horizontal movement subsystem 306 may provide at least some vertical force dissipation of the vertical forces V (in addition to the horizontal force dissipation discussed below) as well.

The method 900 then proceeds to block 908 where horizontal movement of the rack in a substantially horizontal plane is provided for using the rack delivery system. In an embodiment, the horizontal movement subsystem 306 operates at block 908 to provide for horizontal movement of the rack support member 304 relative to the base support member 302 in a substantially horizontal plane. For example, at block 908 the horizontal forces H generated at block 904 may be transmitted through rack delivery support surface 1104 to the base support member 302 (e.g., through each of the first layer 302a, the vertical force dissipation members 302c, and the second layer 302b) and, in response, may impart horizontal motion to the base support member 302 that transmits the horizontal forces H to the horizontal movement subsystem 306. As discussed in further detail below, the horizontal movement subsystem 306 then allows for the rack support member 304 to move relative to the base support member 302 in a substantially horizontal plane (e.g., a plane that includes the rack support member 304) and, in combination with the damping of that relative movement by the resilient members 308, operates to dissipate a portion of the horizontal force H such that that horizontal forces H transmitted through the rack delivery support surface 1104 to the base support member 302 are substantially reduced (e.g., from the 4 g forces that have been found in experimental embodiments to under 1 g forces in desirable frequency ranges) by the horizontal movement subsystem 306 and resilient members 308 before those reduced horizontal forces are transmitted to the rack support member 304 and the rack 200.

Referring back to the specific examples of horizontal movement subsystems discussed above, FIG. 4 illustrates the horizontal movement subsystem 406 provided by a fluid bladder that deforms to allow the rack support member 404 to move relative to the base support member 402 in the substantially horizontal plane at block 908. As discussed above, the fluid bladder may be provided by a deformable material that is filled with fluid and that deforms in a manner that provides sufficient horizontal movement of the rack support member 404 relative to the base support member 402, with the associated force dissipation provided by the resilient members 408, such that the horizontal forces H generated at block 904 will not damage the rack 200 and/or any components in the rack 200. Similarly, FIG. 5 illustrates the horizontal movement subsystem 506 provided by the first flat surface 506a on the base support member 502 that engages moves relative to the second flat surface 506b to allow the rack support member 504 to move relative to the base support member 502 in the substantially horizontal plane at block 908. As discussed above, the first flat surface 506a and the second flat surface 506b may be provided by complementary and relatively low friction surfaces that may be coated with fluids or friction-reducing coatings in order to allow for the relative movement of the rack support member 504 and base support member 502, with the associated force dissipation provided by the resilient members 508, such that the horizontal forces H generated at block 904 will not damage the rack 200 and/or any components in the rack 200.

Similarly, FIG. 6 illustrates the horizontal movement subsystem 606 provided by a plurality of rotatable members that each engage the base support member 602 and the rack support member 604 and rotate to allow the rack support member 604 to move relative to the base support member 602 in the substantially horizontal plane. As discussed above, the rotatable members may be provided by spheres, and may be coated with fluids or friction-reducing coatings in order to allow for the relative movement of the rack support member 604 and base support member 602, with the associated force dissipation provided by the resilient members 608, such that the horizontal forces H generated at block 904 will not damage the rack 200 and/or any components in the rack 200. Similarly, FIG. 7 illustrates the horizontal movement subsystem 706 provided by a plurality of mechanical linkages that each may be mounted to the rack support member 704 and coupled to the second layer 702b of the base support member 702 by at least one element that moves through the slot 706a. As discussed above, the at least one element on each mechanical linkage may move at least partway along the length of the slot 706a, as well as in and out of the slot 706a, and may be coated with fluids or friction-reducing coatings in order to allow for the relative movement of the rack support member 704 and base support member 702, with the associated force dissipation provided by the resilient members 708, such that the horizontal forces H generated at block 904 will not damage the rack 200 and/or any components in the rack 200.

Similarly, FIG. 8 illustrates the horizontal movement subsystem 806 provided by a plurality of mechanical linkages that each may be mounted to the second layer 802b on the base support member 802, and that each may include a pair of rotatable elements 806a that are mounted to the rack support member 804 and configured to move about rotatable couplings to the mechanical linkage. As discussed above, the rotatable elements 806a on each mechanical linkage may be configured to "swing" about their rotatable couplings to allow the rack support member 804 to move in the substantially horizontal plane relative to the base support member 802. And may be coated with fluids or friction-reducing coatings in order to allow for the relative movement of the rack support member 804 and base support member 802, with the associated force dissipation provided by the resilient members 808, such that the horizontal forces H generated at block 904 will not damage the rack 200 and/or any components in the rack 200. While explicitly illustrated herein, one of skill in the art in possession of the present disclosure will recognize how the other mechanism discussed above (e.g., the repelling magnets on the rack support member and base support member, pneumatic horizontal movement subsystems etc.), may provide the relative movement of the rack support member and base support member that, with the associated force dissipation provided by the resilient members, dissipates the horizontal forces generated at block 904 such that those horizontal forces do not damage the rack 200 and/or any components in the rack 200.

The method 900 then proceeds to block 910 where horizontal motion of the rack is damped using the rack delivery system. In an embodiment, the resilient members 308 operate at block 910 to damp the relative horizontal movement of the rack support member 304 and the base support member 302 in order to dissipate the horizontal forces transmitted through the rack delivery support surface 1104 and to the base support member 302 by compressing, deforming, absorbing, and/or otherwise dissipating a portion of the forces generated at block 904. In a specific example, the resilient members 308 include a spring or rubber material that is configured to compress (e.g., as illustrated by the resilient member 308 on the left side of FIG. 12) and expand (e.g., as illustrated by the resilient member 308 on the right side of FIG. 12) such that that relative movement of the rack support member 304 and the base support member 302 is damped and the vertical forces V transmitted through the rack delivery support surface 1104 to the base support member 302 are substantially reduced (e.g., from the 4 g forces that have been found in experimental embodiments to under 1 g forces in desirable frequency ranges) by the resilient members 308 before those reduced horizontal forces are transmitted through the base support member 302, the horizontal movement subsystem 306, the rack support member 304, and to the rack 200.

Thus, embodiments of the device delivery system of the present disclosure provide for the reduction of forces experiences by a device during delivery by mounting the device to a device support member that is movably coupled to a base support member to allow the device support member to move relative to the base support member in a substantially horizontal plane. The base support member may then be set on a delivery support surface and, during delivery, the forces generated through movement of the delivery vehicle and transmitted through the delivery support surface to the base support member will be dissipated via the relative horizontal movement of the device support member and base support member, and the force dissipation provided by resilient members that damp that relative horizontal movement. As such, horizontal forces experienced by the device (and particularly at a top end of a relatively tall device (e.g., a rack) that is mounted at an opposing bottom end to the rack support surface) are substantially reduced, reducing and even eliminating the possibility of damage to the rack and/or components in the rack during rack delivery.

The method 900 may then proceed to block 912 where a movement limiting subsystem on the rack delivery system is activated. In some embodiments, the rack delivery system 300 may be provided with different configurations during different portions of the rack delivery. For example, at some times during the delivery of the rack such as transport of the rack in the rack delivery vehicle discussed above, it is desirable to allow for the relative horizontal movement of the rack support member 304 and the base support member 302 to dissipate forces as discussed above. However, at other times during the delivery of the rack such as movement of the rack 200/rack delivery system 300 to and from the rack delivery vehicle (e.g., from the manufacturer/provider to the rack delivery vehicle, from the rack delivery vehicle to the customer, etc.), it may be desirable to prevent or resist the relative horizontal movement of the rack support member 304 and the base support member 302 (e.g., during lifting of the rack 200/rack delivery system 300 into the rack delivery vehicle, during positioning of the rack 200/rack delivery system 300 in a datacenter, etc.) FIG. 13 illustrates the activation of the motion limiting subsystems 310 by positioning a pin 1300 in the holes that are defined by the base support member 302, the rack support member 304, and the horizontal movement subsystem 306, thus operating to resist movement of the rack support member 304 relative to the base support member 302. While a specific embodiment of the activation of the motion limiting subsystems 310 is illustrated and described in FIG. 13, other engagement and/or locking mechanisms that may be activated to prevent relative movement of the base support member 302 and the rack support member 304 are envisioned as falling within the scope of the present disclosure.

Figure 14:
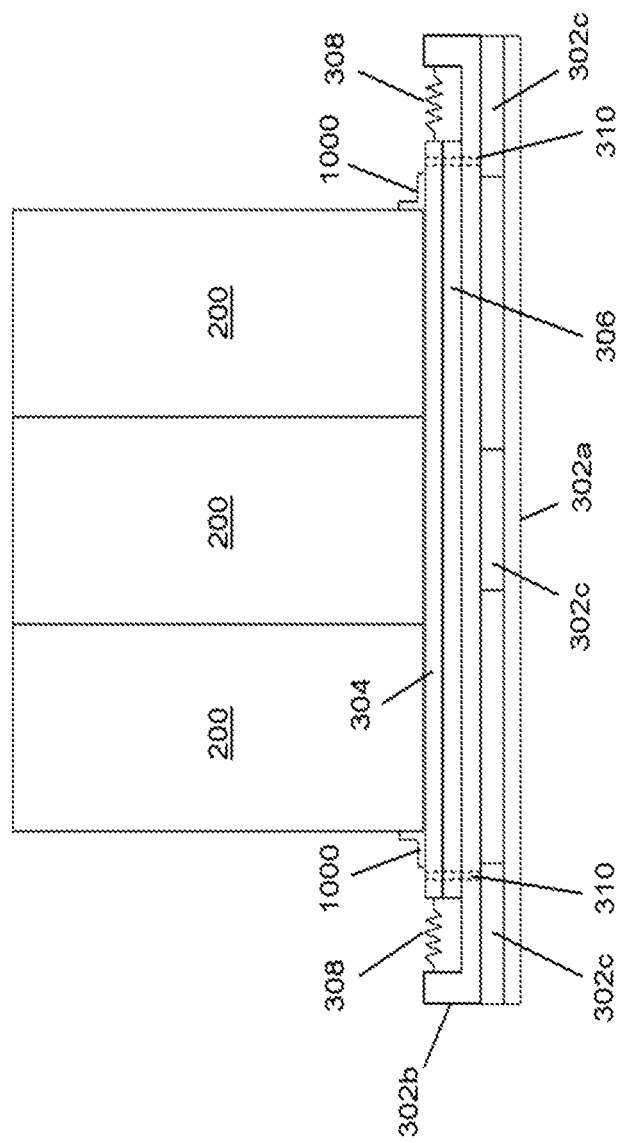
FIG. 14 is a schematic side view illustrating an embodiment of a plurality of the racks of FIG. 2 mounted to the rack delivery system of FIGS. 3A and 3B.

Referring now to FIG. 14, an alternative embodiment of the rack delivery system 300 is illustrated. In the embodiment of FIG. 14, the rack support member 304 is configured, dimensioned, and/or provided such that a plurality of the racks 200 may be mounted to the rack support member 304. For example, each of the racks 200 in FIG. 14 may be secured and/or coupled to each other, as well as mounted to the rack support member 304 via the mounting devices 1000 substantially as discussed above. During the method 900, the rack delivery system 300 may then be positioned in a rack delivery vehicle and the rack support member 304 may then move relative to the base support member 302 substantially as discussed above to dissipate horizontal forces generated during rack delivery such that only a portion of those horizontal forces are transmitted to the racks 200. While only 3 racks are illustrated in FIG. 14, any number of racks or devices may be provided on the rack delivery system 300 to reduce the horizontal forces transmitted to those racks/devices during delivery while remaining within the scope of the present disclosure.

Figure 15:
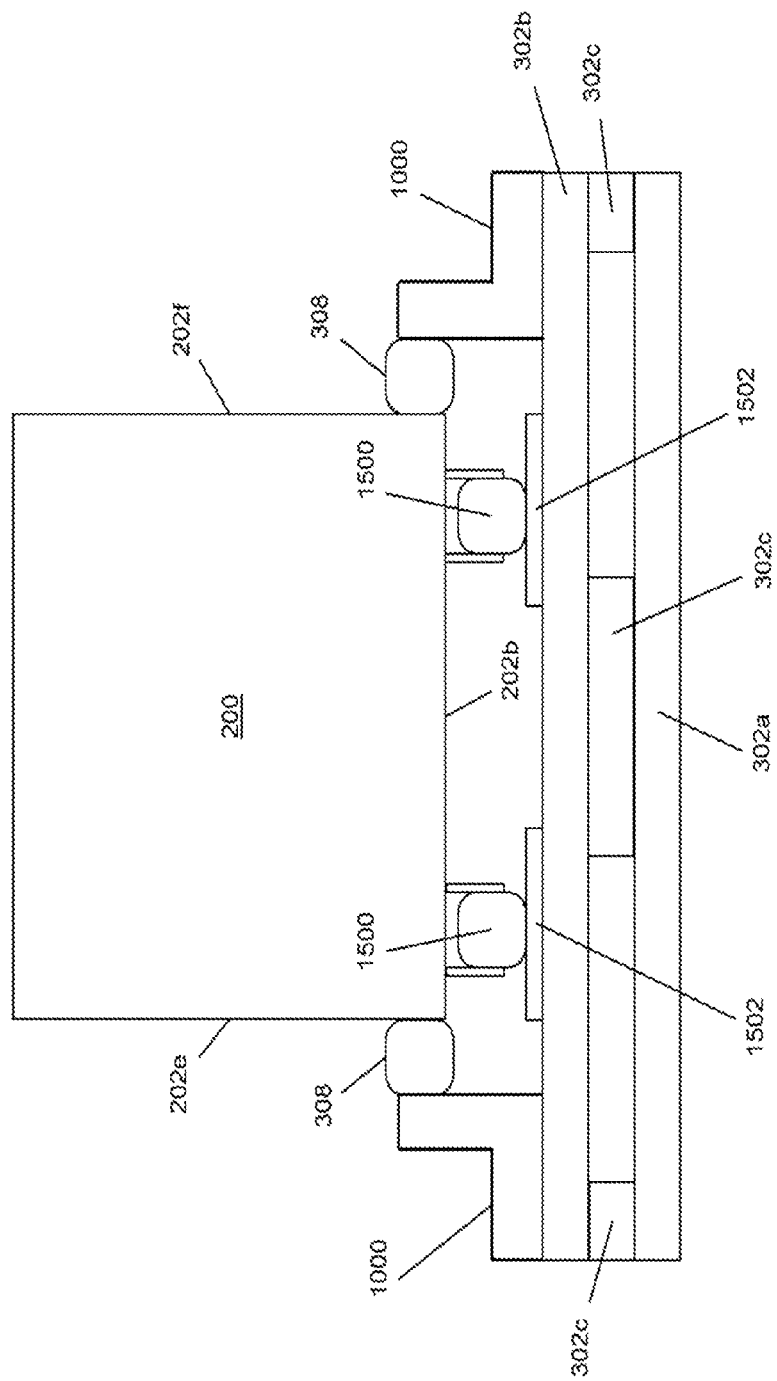
FIG. 15 is a schematic side view illustrating an embodiment of the rack of FIG. 2 coupled to a rack delivery system according to the teachings of the present disclosure.

Referring now to FIG. 15, an alternative embodiment of the rack delivery system 300 is illustrated in which the rack 200 includes castors 1500 (while two castors are illustrated, one of skill in the art in possession of the present disclosure will recognize that racks typically include four castors provided in a spaced-apart orientation on the bottom wall 202b of the rack 200.) In the embodiment illustrated in FIG. 15, the horizontal movement subsystem 306 discussed above with reference to FIG. 3 is provided by the castors 1500 and a respective low friction surface 1502 that may be provided on the second layer 302b of the base support member 302 and in engagement with each castor 1500. During the method 900, the rack delivery system 300 may then be positioned in a rack delivery vehicle and the castors 1500 may then move on the low friction surfaces 1502 and relative to the base support member 302, with the resilient members 308 damping movement substantially as discussed above to dissipate horizontal forces generated during rack delivery such that only a portion of those horizontal forces are transmitted to the rack 200.

Figure 16A:
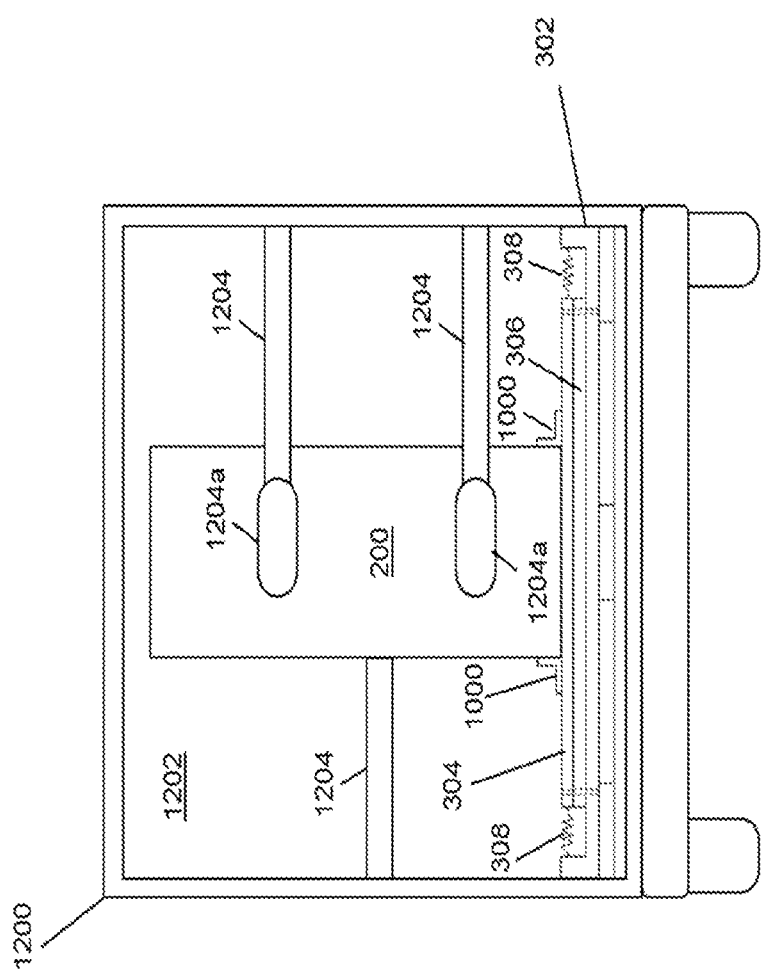
FIG. 16A is a schematic side view illustrating an embodiment of the rack of FIG. 2 coupled to a rack deliver vehicle according to the teachings of the present disclosure.

Referring now to FIGS. 16A and 16B, an embodiment of a rack delivery vehicle 1200 is illustrated that, in the illustrated embodiment, is provided by a truck, but which may include planes, trains, carts, and/or other vehicles known in the art. The rack delivery vehicle 1200 defines a rack delivery housing 1202 and, in the illustrated embodiment, includes the rack delivery system 300 discussed above with reference to FIG. 3 integrated into the rack delivery vehicle 1200. In other words, the rack delivery support surface 1104 in the rack delivery vehicle 1100 of FIG. 11 may be provided by the rack delivery subsystem 300 when the rack delivery subsystem 300 is integrated with the rack delivery vehicle 1200 to provide the "floor" of the rack delivery housing 1202. Furthermore, a plurality of rack support beams 1204 that each include a rack engagement member 1204a may extend into the rack delivery housing 1202 (e.g., from the walls of the rack delivery vehicle 1200) to engage the rack 200 and support the rack 200 during rack delivery. In some experimental embodiments, it has been found that the walls of the rack delivery vehicle 1200 are relatively flexible and thus do no transmit significant portions of the forces generated at block 904 (i.e., as compared with the floor of the rack delivery vehicle 1200). As such, the engagement of the rack with the rack support beams 1204, along with the flexibility of the walls of the rack delivery vehicle and the horizontal relative movement allowed between the rack support member 304 and the base support member 302 by the horizontal movement subsystem 306, further prevents the rack 200 (e.g., upper portions of relatively tall racks) from being subject to undesirably high forces.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A device delivery system, comprising:
   a base support member that includes at least one vertical force dissipation member that is configured to dissipate vertical forces transmitted to the base support member;
   a device support member that is configured to mount to a device;
   a horizontal movement subsystem that couples the device support member to the base support member, wherein the horizontal movement subsystem is decoupled from the at least one vertical force dissipation member and is configured to allow the device support member to move relative to the base support member in a substantially horizontal plane; and
   at least one resilient member that extends between the base support member and the device support member, wherein the at least one resilient member is configured to damp the movement of the device support member relative to the base support member in the substantially horizontal plane.

2. The system of claim 1, further comprising:
   a movement limiting subsystem provided on the base support member and the device support member, wherein the movement limiting subsystem is configured to be activated to resist movement of the device support member relative to the base support member in the substantially horizontal plane.

3. The system of claim 1, wherein the horizontal movement subsystem includes a plurality of rotatable members that engage each of the base support member and the device support member, and wherein the plurality of rotatable members are configured to rotate to allow the device support member to move relative to the base support member in the substantially horizontal plane.

4. The system of claim 1, wherein the horizontal movement subsystem includes a first flat surface of the base support member that engages a second flat surface of the device support member, and wherein the first flat surface is configured to move relative to the second flat surface to allow the device support member to move relative to the base support member in the substantially horizontal plane.

5. The system of claim 1, wherein the horizontal movement subsystem includes a fluid bladder that engages each of the base support member and the device support member, and wherein the fluid bladder is configured to deform to allow the device support member to move relative to the base support member in the substantially horizontal plane.

6. The system of claim 1, wherein the horizontal movement subsystem includes a mechanical linkage coupled to each of the base support member and the device support member, and wherein the mechanical linkage includes at least one moveable coupling that is configured to allow the device support member to move relative to the base support member in the substantially horizontal plane.

7. The device delivery system of claim 1, wherein the horizontal movement subsystem is on a first horizontal plane of the base support member and the at least one vertical dissipating member is on a second horizontal plane of the base support member that is different than the first horizontal plane.

8. The device delivery system of claim 1, wherein the at least one resilient member that extends between the base support member and the device support member extends between a perimeter lip on the base support member and the device support member.

9. The device delivery system of claim 1, wherein the allowing, by the horizontal movement subsystem, the device support member to move relative to the base support member in the substantially horizontal plane includes the horizontal movement subsystem being configured to prevent movement of the device support member in the substantially horizontal plane while the base support member moves in the substantially horizontal plane.

10. A rack delivery system, comprising:
a rack that is configured to house a plurality of computing devices;
a rack shipping pallet that is mounted to the rack, wherein the rack shipping pallet includes:
a base support member that includes at least one vertical force dissipation member that is configured to dissipate vertical forces transmitted to the base support member;
a rack support member that mounted to the rack;
a horizontal movement subsystem that couples the rack support member to the base support member, wherein the horizontal movement subsystem decoupled from the at least one vertical force dissipation member and provides for movement of the rack support member relative to the base support member in a substantially horizontal plane when a force is transmitted to the rack support member; and
at least one resilient member that extends between the base support member and the rack support member, wherein the at least one resilient member is configured to damp the movement of the rack support member relative to the base support member in the substantially horizontal plane.

11. The system of claim 10, further comprising:
a movement limiting subsystem provided on the base support member and the rack support member, wherein the movement limiting subsystem is configured to be activated to resist movement of the rack support member relative to the base support member in the substantially horizontal plane.

12. The system of claim 10, wherein the horizontal movement subsystem includes a plurality of rotatable members that engage each of the base support member and the rack support member, and wherein the plurality of rotatable members are configured to rotate to allow the rack support member to move relative to the base support member in the substantially horizontal plane.

13. The system of claim 10, wherein the horizontal movement subsystem includes a first flat surface of the base support member that engages a second flat surface of the rack support member, and wherein the first flat surface is configured to move relative to the second flat surface to allow the rack support member to move relative to the base support member in the substantially horizontal plane.

14. The system of claim 10, wherein the horizontal movement subsystem includes a fluid bladder that engages each of the base support member and the rack support member, and wherein the fluid bladder is configured to deform to allow the rack support member to move relative to the base support member in the substantially horizontal plane.

15. The system of claim 10, wherein the horizontal movement subsystem includes a mechanical linkage coupled to each of the base support member and the rack support member, and wherein the mechanical linkage includes at least one moveable coupling that is configured to allow the rack support member to move relative to the base support member in the substantially horizontal plane.

16. The system of claim 10, further comprising:
a plurality of racks, wherein the rack support member is mounted to each of the plurality of racks.

17. The rack delivery system of claim 10, wherein the horizontal movement subsystem is on a first horizontal plane of the base support member and the at least one vertical dissipating member is on a second horizontal plane of the base support member that is different than the first horizontal plane.

18. The rack delivery system of claim 10, wherein the at least one resilient member that extends between the base support member and the rack support member extends between a perimeter lip on the base support member and the rack support member.

19. The rack delivery system of claim 10, wherein the allowing, by the horizontal movement subsystem, the rack support member to move relative to the base support member in the substantially horizontal plane includes the horizontal movement subsystem being configured to prevent movement of the rack support member in the substantially horizontal plane while the base support member moves in the substantially horizontal plane.

20. A method for delivering a rack, comprising:
mounting a rack to a rack support member that is moveably coupled to a base support member;
moving the rack and the rack support member and, in response, generating vertical forces and horizontal forces that are transmitted to the rack support member;
dissipating the vertical forces transmitted to the base support member using at least one vertical force dissipating member that is included in the base support member;
providing for movement of the rack support member relative to the base support member in a substantially horizontal plane that occurs in response to the horizontal forces using a horizontal movement subsystem that couples the rack support member to the base support member and that is decoupled from the at least one vertical force dissipation member; and
damping horizontal motion of the rack that occurs in response to the horizontal forces using at least one resilient member that extends between the base support member and the rack support member.

21. The method of claim 20, further comprising:
activating a movement limiting subsystem that is provided on the base support member and the rack support to resist movement of the rack support member relative to the base support member in the substantially horizontal plane.

22. The method of claim 20, wherein the horizontal movement subsystem includes a plurality of rotatable members that engage each of the base support member and the rack support member, when the plurality of rotatable members rotate to allow the rack support member to move relative to the base support member in the substantially horizontal plane.

23. The method of claim 20, wherein the horizontal movement subsystem includes a first flat surface of the base support member that engages a second flat surface of the rack support member, and wherein the first flat surface moves relative to the second flat surface to allow the rack support member to move relative to the base support member in the substantially horizontal plane.

24. The method of claim 20, wherein the horizontal movement subsystem includes a fluid bladder that engages each of the base support member and the rack support member, and wherein the fluid bladder deforms to allow the rack support member to move relative to the base support member in the substantially horizontal plane.

25. The method of claim 20, wherein the horizontal movement subsystem includes a mechanical linkage coupled to each of the base support member and the rack support member, and wherein the mechanical linkage includes at least one moveable coupling that allows the rack support member to move relative to the base support member in the substantially horizontal plane.

26. The method of claim 20, further comprising:
  mounting a plurality of racks to the rack support member that is moveably coupled to a base support member.

27. The method of claim 20, wherein the horizontal movement subsystem is on a first horizontal plane of the base support member and the at least one vertical dissipating member is on a second horizontal plane of the base support member that is different than the first horizontal plane.

28. The method of claim 20, wherein the at least one resilient member that extends between the base support member and the rack support member extends between a perimeter lip on the base support member and the rack support member.

29. The method of claim 20, wherein the providing for movement of the rack support member relative to the base support member in a substantially horizontal plane that occurs in response to the horizontal forces using a horizontal movement subsystem that couples the rack support member to the base support member includes preventing movement of the rack support member in the substantially horizontal plane while the base support member moves in the substantially horizontal plane in response to the horizontal force on the base support member.

* * * * *